(12) United States Patent
Geng et al.

(10) Patent No.: US 12,108,565 B2
(45) Date of Patent: Oct. 1, 2024

(54) LIQUID-COOLED CABINET MANIFOLD AND LIQUID-COOLED CABINET

(71) Applicants: SQ TECHNOLOGY (SHANGHAI) CORPORATION, Shanghai (CN); INVENTEC CORPORATION, Taipei (TW)

(72) Inventors: Zhao Geng, Shanghai (CN); Guangzhao Tian, Shanghai (CN)

(73) Assignees: SQ TECHNOLOGY (SHANGHAI) CORPORATION, Shanghai (CN); INVENTEC CORPORATION, Taipei (TW)

(*) Notice: Subject to any disclaimer, the term of this patent is extended or adjusted under 35 U.S.C. 154(b) by 193 days.

(21) Appl. No.: 17/843,790

(22) Filed: Jun. 17, 2022

(65) Prior Publication Data
US 2022/0322578 A1    Oct. 6, 2022

(30) Foreign Application Priority Data
Mar. 31, 2022    (CN) .......................... 202210344072.2

(51) Int. Cl.
*H05K 7/20*    (2006.01)
*F16L 3/10*    (2006.01)
(Continued)

(52) U.S. Cl.
CPC ............ *H05K 7/20272* (2013.01); *F16L 3/10* (2013.01); *F16L 3/2235* (2013.01);
(Continued)

(58) Field of Classification Search
CPC .......... H05K 7/20272; H05K 7/20627–20645; H05K 7/20763–20781; F16L 3/10;
(Continued)

(56) References Cited

U.S. PATENT DOCUMENTS 11,129,292 B1*   9/2021   Shao ..................... H05K 7/1485
11,800,680 B2*  10/2023   Gao .................... H05K 7/20281
(Continued)

FOREIGN PATENT DOCUMENTS

CN    105704989 A       6/2016
CN    205726834 U   *  11/2016
(Continued)

*Primary Examiner* — Zachary Pape
(74) *Attorney, Agent, or Firm* — Muncy, Geissler, Olds & Lowe, P.C.

(57) ABSTRACT

A liquid-cooled cabinet manifold and a liquid-cooled cabinet are disclosed. The liquid-cooled cabinet manifold includes a main inlet pipe and a main outlet pipe, which are arranged in parallel to and spaced apart from each other. The main inlet pipe has a main inlet port and a branch inlet port, and the main outlet pipe has a main outlet port and a branch outlet port. The branch inlet port is staggered from the branch outlet port along the direction of extension of the main inlet pipe, and an angle is formed between the branch inlet port and the branch outlet port. The branch inlet port and the branch outlet port form a pair connected to an object to be cooled in the liquid-cooled cabinet. When a server with a large depth is accommodated in the cabinet, the angle can be adjusted to ensure a minimized radius of flexure of supply and return pipes.

18 Claims, 5 Drawing Sheets

(51) Int. Cl.
*F16L 3/223* (2006.01)
*F28F 9/02* (2006.01)
*F16L 3/237* (2006.01)

(52) U.S. Cl.
CPC .......... *F28F 9/0243* (2013.01); *F28F 9/0258* (2013.01); *H05K 7/20781* (2013.01); *F16L 3/237* (2013.01)

(58) Field of Classification Search
CPC ....... F16L 3/2235; F16L 3/237; F28F 9/0243; F28F 9/0258
See application file for complete search history.

(56) References Cited

U.S. PATENT DOCUMENTS

| | | | | |
|---|---|---|---|---|
| 2008/0310104 | A1* | 12/2008 | Campbell | H05K 7/20781 29/729 |
| 2013/0319568 | A1* | 12/2013 | Daugherty | B32B 1/08 285/332 |
| 2017/0105313 | A1* | 4/2017 | Shedd | H05K 7/20309 |
| 2017/0321825 | A1* | 11/2017 | Schuster | F16L 37/084 |
| 2018/0303007 | A1* | 10/2018 | Gao | H05K 7/20781 |

FOREIGN PATENT DOCUMENTS

| | | | |
|---|---|---|---|
| CN | 208398451 | U | 1/2019 |
| CN | 209544555 | U | 10/2019 |
| CN | 110418553 | A | 11/2019 |
| CN | 215731961 | U * | 2/2022 |

* cited by examiner

LIQUID-COOLED CABINET MANIFOLD AND LIQUID-COOLED CABINET

CROSS-REFERENCE TO RELATED APPLICATION

This application claims the priority of Chinese patent application number 202210344072.2, filed on Mar. 31, 2022, the entire contents of which are incorporated herein by reference.

TECHNICAL FIELD

The present invention relates to the field of liquid-cooled cabinets and, more specifically, to a liquid-cooled cabinet manifold and a liquid-cooled cabinet.

BACKGROUND

With the vigorous development of computing platforms, practical services are imposing increasingly demanding requirements on the computing power of the underlying hardware infrastructure. Advancements in performance simply lead to increasing power consumption of servers. Meanwhile, along with rising of computing power, process upgrades also bring about significant increases in overall power consumption and heat generation. Given a fixed number of servers per cabinet, significant increases in overall power consumption of cabinets bring great challenges to energy consumption and heat exchange of data centers.

In order to address such challenges, innovations are necessary in cooling technology. The traditional air-cooling mode is gradually approaching its capacity limit and falls short in meeting the requirements of high-power computing chips. The high energy consumption and high performance problems that air cooling cannot solve can be significantly mitigated by liquid cooling. The cold plate-based liquid cooling mode with more prominent thermal conduction capabilities is becoming increasingly important for data centers. The most common liquid cooling-based heat dissipation systems are water cooling-based heat dissipation ones. A water cooling-based heat dissipation system relies on cold plates for heat removal from servers. Uncooled (hot) water is circulated through an outdoor cooling tower for heat exchange, and the cooled (cold) water is distributed to individual cabinets by a cooling distribution unit (CDU), achieving a stable cooling effect with higher efficient than wind energy. Moreover, water cooling dispenses with cooling fans in cabinets, reducing cabinet noise that is unfriendly to the environment. Although water cooling systems require dedicated cabinets and are associated with high structural complexity, high cost and very high maintenance complexity, they can satisfy the cooling and energy saving requirements of large data centers. Compared with traditional air-cooled data centers, the energy consumption of water-cooled data centers is 40% lower. Therefore, they are expected to gain increasing popularity in the future.

Therefore, there is an urgent need for a liquid-cooled cabinet manifold, which can meet the heat dissipation requirements of existing standard cabinets.

SUMMARY OF THE DISCLOSURE

It is an object of the present invention to provide a liquid-cooled cabinet manifold and a liquid-cooled cabinet, which can satisfy the heat dissipation requirements of existing standard cabinets.

To this end, the present invention provides a liquid-cooled cabinet manifold for cooling a liquid-cooled cabinet, comprising a main inlet pipe and a main outlet pipe, which are arranged in parallel to and spaced apart from each other, the main inlet pipe having a main inlet port and a branch inlet port, the main outlet pipe having a main outlet port and a branch outlet port, the branch inlet port staggered from the branch outlet port along a direction of extension of the main inlet pipe, the branch inlet port and the branch outlet port forming an angle therebetween, the branch inlet port and the branch outlet port forming a pair which is connected to an object to be cooled in the liquid-cooled cabinet.

Optionally, in operation, a cooling liquid may be introduced into the main inlet pipe from the main inlet port, flow through the branch inlet port and the object to be cooled into the main outlet pipe from the branch outlet port corresponding to the branch inlet port, and exit the main outlet port.

Optionally, in the direction of extension of the main inlet pipe, the adjacent branch inlet and outlet ports may be spaced apart from each other.

Optionally, the angle may range from 0° to 180°.

Optionally, a plurality of the branch inlet ports and a plurality of the branch outlet ports may be provided, and a number of the branch inlet ports may be equal to a number of the branch outlet ports and greater than or equal to a number of the objects to be cooled.

Additionally, the branch inlet ports and the branch outlet ports may be all provided with a quick-connect connector, wherein the quick-connect connectors at the branch inlet ports are all provided with a first identifier, wherein the quick-connect connector at the branch outlet ports are all provided with a second identifier, and wherein the first identifiers and the second identifiers are configured to distinguish the branch inlet ports from the branch outlet ports.

Additionally, if the numbers of the branch inlet ports and the branch outlet ports are equal to the number of the objects to be cooled, the pairs of the branch inlet ports and the branch outlet ports are connected to the respective objects to be cooled by the quick-connect connectors.

Alternatively, if the numbers of the branch inlet ports and the branch outlet ports are greater than the number of the objects to be cooled, some pairs of branch inlet and outlet ports may be connected to the respective objects to be cooled by the quick-connect connectors, with the quick-connect connectors at remaining pairs of the branch inlet ports and the branch outlet ports are covered with caps configured to close the branch inlet and outlet ports.

Additionally, the liquid-cooled cabinet manifold may further comprise a plurality of securing members which are spaced apart from one another, the securing members configured to connect the main inlet pipe and the main outlet pipe in such a manner that they are parallel to and spaced apart from each other and pre-secure them at a predetermined location of the liquid-cooled cabinet.

Additionally, each securing member may comprise a pipe clamp and a locator, the pipe clamp configured to secure the main inlet pipe and the main outlet pipe and enable an adjustment of the angle, the locator fitting over the pipe clamp and configured to pre-secure the main inlet pipe and the main outlet pipe at the predetermined location through the pipe clamp.

Additionally, the pipe clamp may be a dismantlable block defining two parallel through holes, through which the main inlet pipe and the main outlet pipe are respectively inserted, wherein the through holes each define in an inner wall thereof a plurality of grooves which are uniformly distributed circumferentially, and wherein the main inlet pipe and the main outlet pipe each define on an outer wall thereof limiting means each in engagement with a respective one of the grooves on the main inlet pipe or the main outlet pipe, so that the main inlet pipe and the main outlet pipe are prevented from rotating, and the branch inlet port and the branch outlet port are fixed at the predetermined angle.

Optionally, the main inlet pipe may have one end and another end opposing said end, with the main outlet pipe also having one end and another end opposing said end, wherein one end of the main inlet pipe arranged on the same side as one end of the main outlet pipe, wherein the main inlet pipe is so oriented that one end is located above the other end thereof, and wherein the main inlet and outlet ports are staggered from each other in the direction of extension of the main inlet pipe so that the main inlet port is situated between one end of the main inlet pipe and the branch inlet port and that the main outlet port is situated between one end of the main outlet pipe and the branch outlet port.

Additionally, the liquid-cooled cabinet manifold may further comprise two exhaust valves and two drain valves, the two exhaust valves provided respectively at one end of the main inlet pipe and one end of the main outlet pipe, the two drain valves provided respectively at the other end of the main inlet pipe and the other end of the main outlet pipe.

Additionally, the liquid-cooled cabinet manifold may further comprise a header inlet pipe and a header outlet pipe, the header inlet pipe connected to the main inlet port so as to be able to supply a cooling liquid to the main inlet pipe via the main inlet port, the header outlet pipe connected to the main outlet port so as to be able to discharge the cooling liquid from the main outlet pipe via the main outlet port.

Optionally, the main inlet and outlet pipes may be both PVDF polymer pipes.

In another aspect, the present invention provides a liquid-cooled cabinet comprising a cabinet body and the liquid-cooled cabinet manifold as defined above. The liquid-cooled cabinet manifold is secured in a rear cable management region of the cabinet body, and the cabinet body has therein at least one object to be cooled, each having a set of supply and return ports which are spaced apart from each other along the direction of extension of the liquid-cooled cabinet manifold. Each set of supply and return ports corresponds to a respective pair of branch inlet and outlet ports so that the branch inlet port is connected to the supply port and the branch outlet port is connected to the return port.

Optionally, in operation, a cooling liquid flows into the supply port from the branch inlet port of the main inlet pipe, circulate to the branch outlet port from the return port, and exit the main outlet pipe.

Optionally, a plurality of locators may be arranged to be spaced apart from one another along the direction of extension of the liquid-cooled cabinet manifold on an inner wall of the cabinet body in the rear cable management region, wherein the pipe clamps are fixed to the locators so that the main inlet and outlet pipes are pre-secured to the locators by the pipe clamps.

Additionally, each pair of branch inlet and outlet ports may be staggered from each other in a 2 U space.

Additionally, the branch inlet and outlet ports may be all provided with a quick-connect connector, with the supply and return ports being all provided with a second quick-connect connector, wherein the first quick-connect connector at the branch inlet port is connected to the second quick-connect connector at the supply port, and the first quick-connect connector at the branch outlet port is connected to the second quick-connect connector at the return port.

Additionally, the first quick-connect connectors may be male quick-connect connectors and the second quick-connect connectors may be female quick-connect connectors.

Compared with the prior art, the present invention has the following beneficial effects:

1. In case of a server with a large depth being accommodated in the liquid-cooled cabinet, the angle between the branch inlet and outlet ports can be adjusted to ensure a minimized radius of flexure of supply and return pipes. Additionally, through staggering the branch inlet port from the branch outlet port along the direction of extension of the main inlet pipe, when one of them is provided with a quick-connect connector, mating and unmating of the other are not affected.

2. Two exhaust valves are provided respectively at one end of the main inlet pipe and one end of the main outlet pipe, and two drain valves are provided respectively at the other end of the main inlet pipe and the other end of the main outlet pipe. The main inlet pipe is oriented so that one end is located above the other end thereof. As such, the exhaust valves are arranged at the top of the main inlet and outlet pipes, allowing easy release of air in the manifold and depressurization thereof. Moreover, the drain valves are arranged at the bottom of the main inlet and outlet pipes to discharge impurities accumulated there, preventing damage to delicate structures of quick-connect connectors on the liquid-cooling pipes and of cold plates.

3. Both the main inlet and outlet pipes are made of a PVDF polymer. Compared with conventional stainless steel pipes, such polymer pipes can be more easily manufactured using a cheaper mold, have a lighter weight, and allow easier assembly, operation and maintenance.

4. The branch inlet and outlet ports are both provided with a first quick-connect connector, and the supply and return ports are both provided with a second quick-connect connector. The first quick-connect connector at the branch inlet port is connected to the second quick-connect connector at the supply ports, and the first quick-connect connector at the branch outlet port is connected to the second quick-connect connector at the return port. The first quick-connect connectors are male quick-connect connectors, and the second quick-connect connectors are female quick-connect connectors. The first quick-connect connectors can be mated and unmated by a single hand. The quick-connect connector at the branch inlet port is provided with a first identifier, and the quick-connect connector at the branch outlet port is provided with a second identifier. The first and second identifiers are adapted to distinguish the branch inlet port from the branch outlet port, facilitating subsequent operation and maintenance.

5. A plurality of securing members are included and spaced from one another. The securing members are adapted to connect the main inlet and outlet pipes so that they run in parallel to, and are spaced apart from, each other, and to pre-secure them at a predetermined location of the liquid-cooled cabinet. Each securing member includes a pipe clamp and a locator. The pipe clamp fixes the main inlet and outlet pipes and enables the aforementioned angle to be adjusted. The locator fits over the pipe clamp and pre-secures the main inlet and outlet pipes at the predetermined location through the pipe clamp. Such dedicated locators provided on the cabinet body are adapted to pre-secure the liquid-cooled cabinet manifold. Final securing of the entire liquid-cooled cabinet manifold is accomplished by the pipe clamps in the securing members, enabling the liquid-cooled cabinet manifold to satisfy the requirements for easy computer maintenance and replacement.

Figure 1:
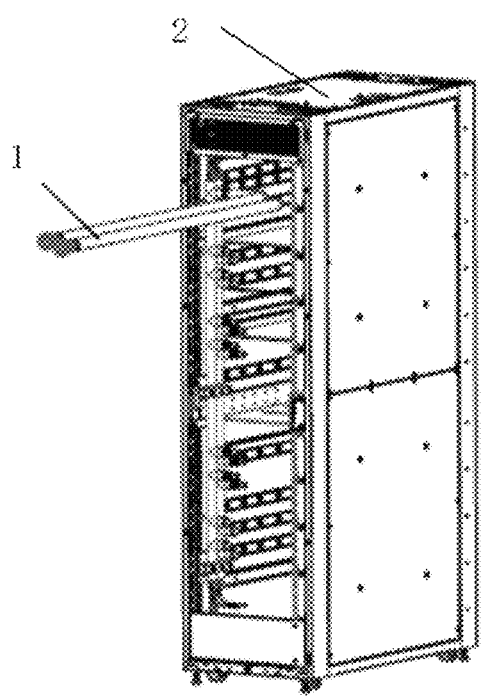
FIG. 1 is a schematic diagram showing the structure of a liquid-cooled cabinet according to an embodiment of the present invention.

DESCRIPTION OF REFERENCE NUMERALS
IN DRAWINGS

1—Liquid-Cooled Cabinet Manifold; 10—Main Inlet Pipe; 11—Main Inlet Port; 12—Branch Inlet Port; 13—Limiting Means; 20—Main Outlet Pipe; 21—Main Outlet Port; 22—Branch Outlet Port; 30—Pipe Clamp; 31—Groove; 41—Header Outlet Pipe; 42—Header Inlet Pipe; 51—Exhaust Valve; 52—Drain Valve; 60—Quick-Connect Connector; 70—Locator; 80—Base;

2—Cabinet Body; 211, 212, 213, 214—Object To Be Cooled; 220—Power Shelf.

DETAILED DESCRIPTION

The Liquid-cooled cabinet manifold and liquid-cooled cabinet of the present invention will be described in greater detail below with reference to the accompanying drawings, which present a preferred embodiment of the invention. It would be appreciated that those skilled in the art can make changes to the invention disclosed herein while still obtaining the beneficial results thereof. Therefore, the following description shall be construed as being intended to be widely known by those skilled in the art rather than as limiting the invention.

For the sake of clarity, not all features of an actual implementation are described in this specification. In the following, description and details of well-known functions and structures are omitted to avoid unnecessarily obscuring the invention. It should be appreciated that in the development of any such actual implementation, numerous implementation-specific decisions must be made to achieve specific goals of the developers, such as compliance with system-related and business-related constrains, which may vary from one implementation to another. Moreover, it should be appreciated that such a development effort might be complex and time consuming, but would nevertheless be a routine undertaking for those of ordinary skill in the art.

Objects and features of the present invention will become more apparent upon reading the following more detailed description thereof made with reference to the accompanying drawings and a particular embodiment. Note that the figures are provided in a very simplified form not necessarily drawn to exact scale for the only purpose of facilitating easy and clear description of the disclosed embodiment.

Figure 2:
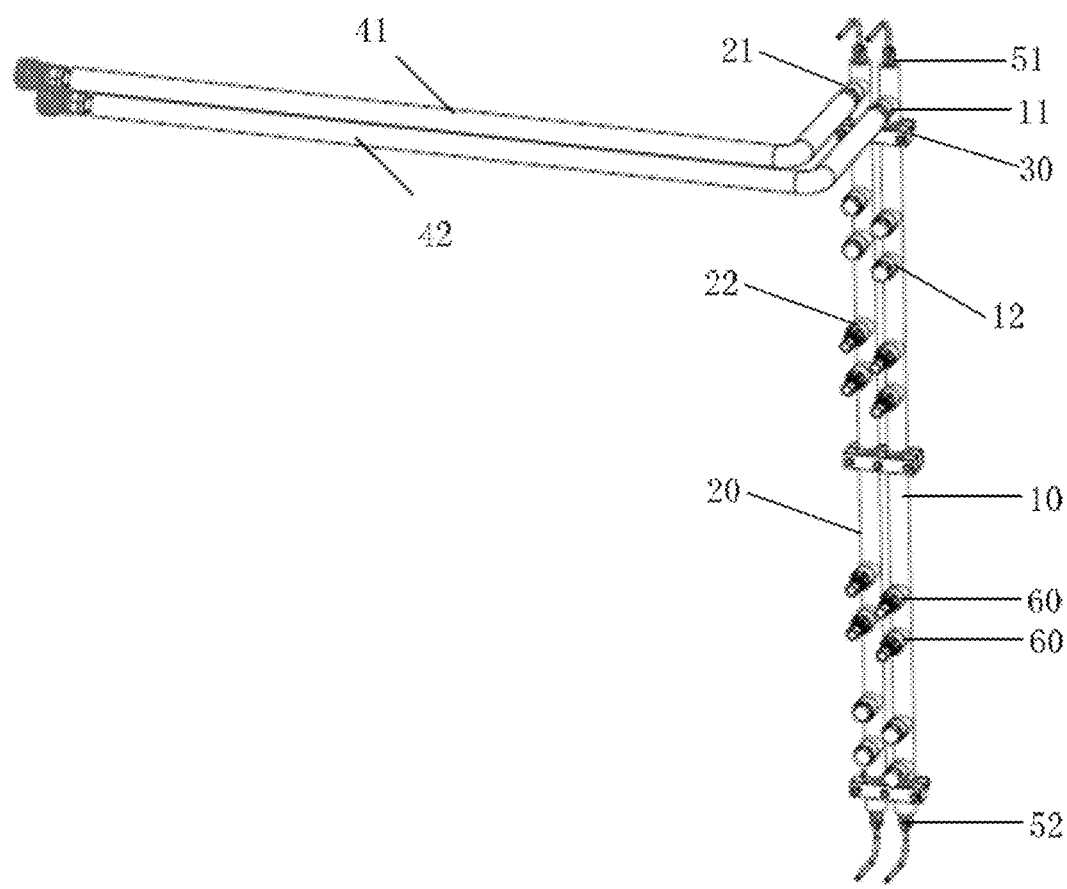
FIG. 2 is a schematic diagram showing the structure of a liquid-cooled cabinet manifold according to an embodiment of the present invention.

FIG. 1 is a schematic diagram showing the structure of the liquid-cooled cabinet according to the embodiment. FIG. 2 is a schematic diagram showing the structure of the liquid-cooled cabinet manifold according to the embodiment. As shown in FIGS. 1 to 2, the liquid-cooled cabinet provided in the present embodiment includes the liquid-cooled cabinet manifold 1 and a cabinet body 2. There is at least one object to be cooled in the cabinet body 2. All the object(s) to be cooled is/are stacked together in the cabinet body 2. Each object to be cooled is provided with a cold plate. The cabinet body 2 has a rear cable management region where the liquid-cooled cabinet manifold 1 is secured. Because of a relatively small overall size of the liquid-cooled cabinet manifold 1, despite the disposal of the liquid-cooled cabinet manifold 1 in the cabinet body 2, it can be still ensured that industrial power connectors and cables can be passed through the cabinet body 2. In this way, spatial utilization is increased, and resistance to wind for heat dissipation is reduced in the rear region of the cabinet.

The liquid-cooled cabinet manifold 1 is configured for cooling the liquid-cooled cabinet. The liquid-cooled cabinet manifold 1 includes a main inlet pipe 10 and a main outlet pipe 20, which are arranged in parallel to and spaced apart from each other. The main inlet pipe 10 has a main inlet port 11 and branch inlet ports 12, and the main outlet pipe 20 has a main outlet port 21 and branch outlet ports 22. The branch inlet ports 12 and the branch outlet ports 22 are staggered along the direction of extension of the main inlet pipe 10. Preferably, along the direction of extension of the main inlet pipe 10, adjacent branch inlet ports 12 and branch outlet ports 22 are spaced apart from each other so that one in each set of branch inlet 12 and outlet 22 ports is connected to an object to be cooled, while mating and unmating of the other are made very inconvenient.

The branch inlet ports 12 and the branch outlet ports 22 form an angle therebetween, which may be arbitrarily selected from the range of 0°-180°. The branch inlet ports 12 are paired with the respective branch outlet ports 22, and each pair of branch inlet 12 and outlet 22 ports is connected to one object to be cooled in the liquid-cooled cabinet.

During operation of the liquid-cooled cabinet manifold, a cooling liquid is introduced into the main inlet pipe 10 from the main inlet port 11 and flows through the objects to be cooled from the respective branch inlet ports 12 into the main outlet pipe 20 via the respective branch outlet ports 22 corresponding to the respective branch inlet ports 12. After that, it leaves from the main outlet port 21.

There are both a plurality of branch inlet ports 12 and plurality of branch outlet ports 22, and the number of branch inlet ports 12 is equal to that of the branch outlet ports 22 and is equal to or greater than the number of objects to be cooled.

The branch inlet ports 12 and branch outlet ports 22, which are configured to connect to objects to be cooled, are all provided with a quick-connect connector 60. The quick-connect connector 60 of each branch inlet port 12 is provided with a first identifier, and the quick-connect connector 60 of each branch outlet port 22 is provided with a second identifier. The first and second identifiers are provided to distinguish the branch inlet ports 12 from the branch outlet ports 22. The first and second identifiers may be colors (e.g., the first identifier is blue and the second identifier is red), shapes (e.g., the first identifier is triangular and the second identifier is round), letters (e.g., the first identifier is "I" and the second identifier is "O") or the like. They can facilitate later operation and maintenance. The quick-connect connectors 60 can be quickly mated or unmated by a single hand. Both the connection between the branch inlet ports 12 and the main inlet pipe 10, and the connection between the branch outlet ports 22 and the main outlet pipe 20 are established by hot melting. This approach is advantageous in a simple process and low fabrication cost over square stainless steel manifolds. Any branch inlet port 12 or branch outlet port 22, which is not connected to an object to be cooled, is provided with a cap that closes the branch inlet port 12 or branch outlet port 22. In other words, when the numbers of branch inlet ports 12 and branch outlet ports 22 are equal to that of the objects to be cooled, each pair of branch inlet 12 and outlet 22 ports is connected to a respective one of the objects to be cooled by quick-connect connectors 60. When the numbers of branch inlet ports 12 and branch outlet ports 22 are greater than that of the objects to be cooled, some of the branch inlet ports 12 and branch outlet ports 22 are connected to the objects to be cooled via quick-connect connectors 60, while the remaining ones of the branch inlet ports 12 and branch outlet ports 22 are closed with caps. Sealing rings such as O-rings are disposed at the junctions of the quick-connect connectors 60 and caps with the branch outlet ports 22 and branch inlet ports 12 in order to seal the quick-connect connectors 60 and the caps against the branch outlet ports 22 and the branch inlet ports 12.

Figure 5:
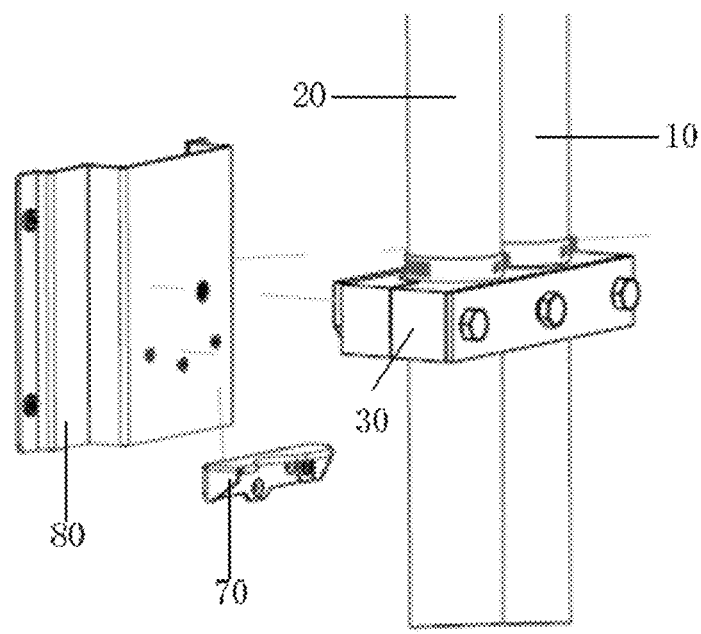
FIG. 5 is a schematic diagram showing the structure of a securing member according to an embodiment of the present invention.
Figure 6:
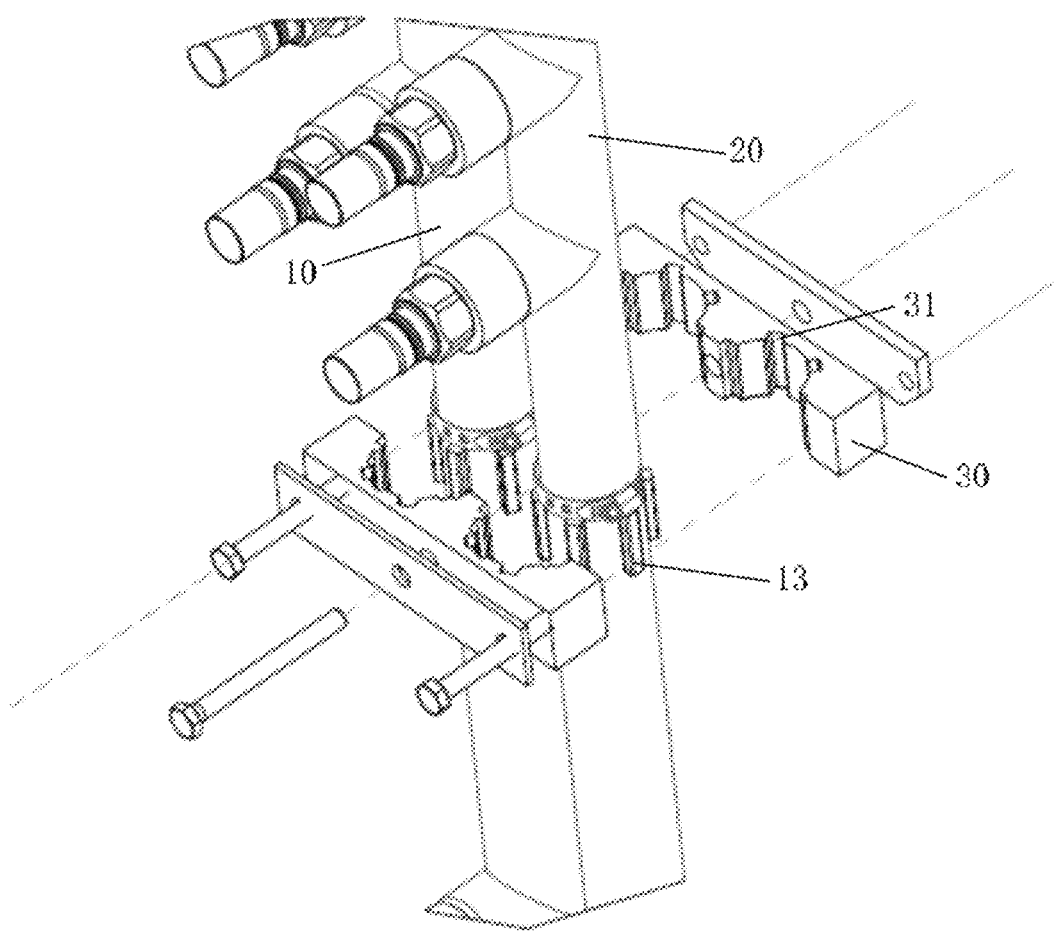
FIG. 6 is a structural schematic of a pipe clamp and limiting means according to an embodiment of the present invention.

FIG. 5 is a schematic diagram showing the structure of a securing member according to the present embodiment. FIG. 6 is a structural schematic of a pipe clamp and limiting means according to the embodiment. As shown in FIGS. 5 and 6, the liquid-cooled cabinet manifold 1 further includes a plurality of securing members, which are spaced apart from one another and adapted to connect the main inlet pipe 10 and main outlet pipe 20 in such a manner they run in parallel and are spaced apart from each other and pre-secure them at a predetermined location of the liquid-cooled cabinet. In the present embodiment, the liquid-cooled cabinet manifold 1 includes three such spaced securing members, which are equidistantly arranged so that one of them is close to one end of the main inlet pipe 10 and the main outlet pipe 20, another one of them is close to the other end of the main inlet pipe 10 and the main outlet pipe 20, and the remaining one is between the above two ends.

Each securing member includes a pipe clamp 30, which fixes the main inlet pipe 10 and the main outlet pipe 20 and allows adjustment of the aforesaid angle. In the present embodiment, the three pipe clamps 30 pre-secure the main inlet pipe 10 and the main outlet pipe 20 together. In case of a large size and a heavy weight of the manifold, each securing member may further include a locator 70 and a base 80. The base 80 is fixed on a side wall of the cabinet body 2, and the locator 70 is mounted on the base 80 so as to fit over the pipe clamp 30. The pipe clamps 30 pre-secure the main inlet pipe 10 and the main outlet pipe 20 at the predetermined location so as to pre-position the main inlet pipe 10 and the main outlet pipe 20. The locators 70 and bases 80 are arranged so as to be spaced apart from one another along the direction of extension of the liquid-cooled cabinet manifold 1 on an inner wall of the cabinet body 2 in the rear cable management region. The pipe clamps 30 are fixed to the locators 70, allowing the main inlet pipe 10 and the main outlet pipe 20 to be pre-secured to the locators 70 via the pipe clamps 30. The bases 80 are fitted over the side wall of the cabinet body 2. Thus, the shape of the base 80 matches a surface shape of the side wall of the cabinet body 2. The locator 70 is generally L-shaped and includes a securing portion and a holding portion. The securing portion is fixed to the base 80, and the holding portion fastens the pipe clamp 30.

The pipe clamp 30 is a dismantlable block and defines two parallel through holes, through which the main inlet pipe 10 and the main outlet pipe 20 are respectively inserted. Additionally, the pipe clamp 30 includes two clamp members defining arc-shaped grooves 31 and two fastening sheets. The two fastening sheets are disposed external to the respective clamp members, and the grooves 31 of one clamp member are aligned with those of the other clamp member so that they define the two through holes. The clamp members and the fastening sheets are connected by at least two bolts. Final assembly can be accomplished by tightening all the bolts subsequent to pre-positioning of the pipe clamps 30 on the locators. The whole assembly process is simple and easy to implement, facilitating operation and maintenance of the computer room.

The grooves 31 are uniformly distributed over the circumferences of the inner walls of the through holes. Additionally, limiting means are provided over outer walls of the main inlet pipe 10 and the main outlet pipe 20. Each limiting means engages with one groove 31 for the main inlet pipe 10 or the main outlet pipe 20, thus preventing rotation of the main inlet pipe 10 and the main outlet pipe 20 and fixing the branch inlet ports 12 and the branch outlet ports 22 at a predetermined angle with respect to each other. The angle ranges from 0° to 180°. When a server with a large depth is accommodated in the cabinet, the angle between the branch inlet ports 12 and branch outlet ports 22 may be adjusted to a value in the range of 0°-90°, preferably 0°, 30° or 60°. This can ensure a minimized radius of flexure at the junctions of return and supply pipes of server cold plates (or cold plates) with the branch inlet ports 12 and branch outlet ports 22, which can prevent the pipes from being crushed to increase resistance to flow.

In the present embodiment, the angle can ensure a minimized radius of flexure of pipes connected to the branch inlet ports 12 and branch outlet ports 22, thus ensuring that the pipes will not be crushed to increase resistance to flow.

The main inlet pipe 10 includes one end and another end opposing said end. The main outlet pipe 20 also includes one end and another end opposing said end. One end of the main inlet pipe 10 is arranged on the same side as one end of the main outlet pipe 20. The main inlet pipe 10 is oriented so that one end is located above the other end thereof.

The main inlet port 11 and the main outlet port 21 are staggered along the direction of extension of the main inlet pipe 10 so that the main inlet port 11 is located between one end of the main inlet pipe 10 and the branch inlet ports 12 and that the main outlet port 21 is located between one end of the main outlet pipe 20 and the branch outlet ports 22.

Both the main inlet pipe 10 and the main outlet pipe 20 are made of a PVDF polymer. Replacing the conventional stainless steel with the PVDF polymer is advantageous in that, compared with stainless steel pipes, polymer pipes can be more easily manufactured using a cheaper mold, have a lighter weight, and allow easier assembly, operation and maintenance.

The liquid-cooled cabinet manifold 1 further includes two exhaust valves 51 and two drain valves 52. The two exhaust valves 51 are disposed respectively at one end of the main inlet pipe 10 and one end of the main outlet pipe 20. The two drain valves 52 are disposed respectively at the other end of the main inlet pipe 10 and the other end of the main outlet pipe 20. As such, the exhaust valves 51 are arranged at the top of the main inlet pipe 10 and the main outlet pipe 20, allowing easy release of air in the manifold and depressurization thereof. Moreover, the drain valves 52 are arranged at the bottom of the main inlet pipe 10 and the main outlet pipe 20 to discharge impurities accumulated there, preventing damage to delicate structures of the quick-connect connectors 60 on the liquid-cooling pipes and of the cold plates.

The liquid-cooled cabinet manifold 1 further includes a header inlet pipe 42 and a header outlet pipe. The header inlet pipe 42 is connected to the main inlet port 11 and supplies a cooling liquid to the main inlet pipe 10 via the main inlet port 11. The header outlet pipe is connected to the main outlet port 21 and discharges the cooling liquid from the main outlet pipe 20 via the main outlet port 21.

Each object to be cooled includes a supply pipe and a return pipe. One end of the supply pipe is connected to a cold plate for the object to be cooled, and the other end thereof is provided with a supply port. One end of the return pipe is connected to the cold plate for the object to be cooled, and the other end thereof is provided with a return port. In this way, each object to be cooled has a set of supply and return ports, which are spaced from each other along the direction of extension of the liquid-cooled cabinet manifold 1. Each pair of branch inlet 12 and outlet 22 ports corresponds to a respective set of supply and return ports, wherein the branch inlet port 12 is connected to the supply port and the branch outlet port 22 to the return port.

During operation of the liquid-cooled cabinet, in the liquid-cooled cabinet manifold, a cooling liquid is introduced into the main inlet pipe 10 from the branch inlet ports 12 and then flows to the respective supply ports. Subsequently, it flows out of the main outlet pipe 20 from the branch outlet ports 22 through the respective return ports. In this way, a cooling circuit is formed, in which the cooling liquid is circulated. The cooling liquid is gathered at a cabinet level, and the individual objects to be cooled are connected to the liquid-cooled cabinet manifold 1 by the respective sets of supply and return ports and then to a cooling distribution unit (CDU). Heat is taken away from the equipment to be cooled (the cabinet body 2) by heat exchange. In this way, the heat dissipation requirements of the cabinet body 2 are satisfied.

Figure 3:
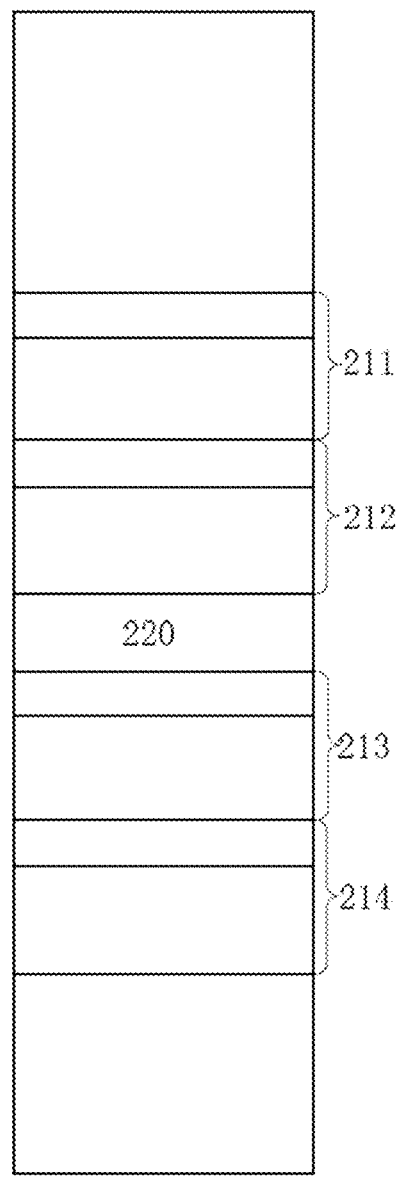
FIG. 3 is a simplified schematic diagram showing the structure of a cabinet body of a liquid-cooled cabinet according to an embodiment of the present invention.

FIG. 3 is a simplified schematic diagram showing the structure of the cabinet body of the liquid-cooled cabinet according to the present embodiment. As shown in FIG. 3, in the present embodiment, the cabinet body 2 is a standard cabinet body including four objects 211, 212, 213, 214 to be cooled which are stacked together (i.e., 2 U spaces). A power shelf is disposed between the objects 212, 213 to be cooled. Each pair of branch inlet 12 and outlet 22 ports is staggered from each other in one 2 U space so that when one of them is provided with a quick-connect connector 60, mating and unmating of the other are not affected. Each set of branch inlet 12 and outlet 22 ports is arranged in a rear cable management region of the 2 U space. That is, the branch inlet ports 12 and branch outlet ports 22 are arranged in accordance with the arrangement of the supply and return ports, and any pair of branch inlet 12 and outlet 22 ports not intended to cool a server (object to be cooled) is not necessary to be connected to supply and return ports and are instead closed with caps. In particular, first quick-connect connectors 60 are provided at the branch inlet ports 12 and the branch outlet ports 22, and second quick-connect connectors 60 are provided at the supply and return ports. The first quick-connect connectors 60 at the branch inlet ports 12 are adapted to be connected to the second quick-connect connectors 60 at the supply ports, and the first quick-connect connectors 60 at the branch outlet ports 22 are adapted to be connected to the second quick-connect connectors 60 at the return ports. The first quick-connect connectors 60 are male quick-connect connectors 60, and the second quick-connect connectors 60 are female quick-connect connectors 60. The quick-connect connectors 60 and the caps may be adapted and replaced according to the configuration of the cabinet. In this way, the needs of multiple cabinet configurations can be met. Moreover, the locations of the quick-connect connectors 60 and the caps may also be adapted according to the configuration of the cabinet. In this way, the heat dissipation requirements of various standard cabinets can be satisfied. Thus, the same set of main pipes of the manifold can meet the needs of different cabinet layouts, making it suitable for general-purpose use.

Figure 4:
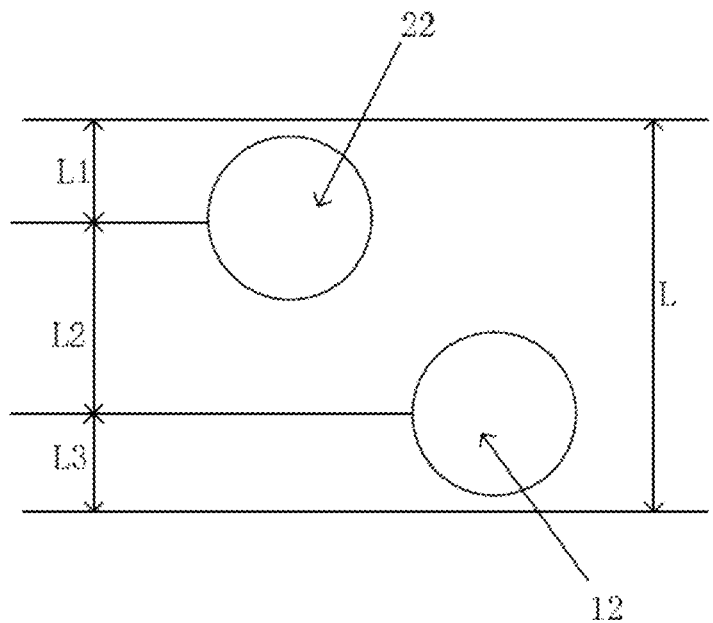
FIG. 4 is a schematic diagram showing locations of inlet and outlet ports in a 2 U space according to an embodiment of the present invention.

FIG. 4 is a schematic diagram showing locations of inlet and outlet ports in a 2 U space according to the present embodiment. As shown in FIG. 4, in conjunction with FIG. 2, an object to be cooled in the 2 U space includes a top surface and a bottom surface. The branch inlet port 12 is arranged in the vicinity of the bottom surface, while the branch outlet port 22 is arranged in the vicinity of the top surface.

In summary, the present invention provides a liquid-cooled cabinet manifold and a liquid-cooled cabinet. The liquid-cooled cabinet manifold includes a main inlet pipe and a main outlet pipe, which are arranged in parallel to and spaced apart from each other. The main inlet pipe has a main inlet port and branch inlet ports, and the main outlet pipe has a main outlet port and branch outlet ports. The branch inlet ports are staggered from the branch outlet ports along the direction of extension of the main inlet pipe, and an angle is formed between the branch inlet ports and the branch outlet ports. The branch inlet and outlet ports are paired, and each pair of branch inlet and outlet ports is connected to an object to be cooled in the liquid-cooled cabinet. According to the present invention, in case of a server with a large depth being accommodated in the liquid-cooled cabinet, the angle between the branch inlet and outlet ports can be adjusted to ensure a minimized radius of flexure of supply and return pipes. Additionally, through staggering the branch inlet ports from the branch outlet ports along the direction of extension of the main inlet pipe, for each pair of branch inlet and outlet ports, when one of them is provided with a quick-connect connector, mating and unmating of the other are not affected.

Further, two exhaust valves are provided respectively at one end of the main inlet pipe and one end of the main outlet pipe, and two drain valves are provided respectively at the other end of the main inlet pipe and the other end of the main outlet pipe. The main inlet pipe is oriented so that one end is located above the other end thereof. As such, the exhaust valves are arranged at the top of the main inlet and outlet pipes, allowing easy release of air in the manifold and depressurization thereof. Moreover, the drain valves are arranged at the bottom of the main inlet and outlet pipes to discharge impurities accumulated there, preventing damage to delicate structures of quick-connect connectors on the liquid-cooling pipes and of cold plates.

Further, both the main inlet and outlet pipes are made of a PVDF polymer. Compared with conventional stainless steel pipes, such polymer pipes can be more easily manufactured using a cheaper mold, have a lighter weight, and allow easier assembly, operation and maintenance.

Further, the branch inlet and outlet ports are provided with a first quick-connect connector, and the supply and return ports are provided with a second quick-connect connector. The first quick-connect connectors at the branch inlet ports are connected to the second quick-connect connectors at the supply ports, and the first quick-connect connectors at the branch outlet ports are connected to the second quick-connect connectors at the return ports. The first quick-connect connectors are male quick-connect connectors, and the second quick-connect connectors are female quick-connect connectors. The first quick-connect connectors can be mated and unmated by a single hand. The quick-connect connectors at the branch inlet ports are each provided with a first identifier, and the quick-connect connectors at the branch outlet ports are each provided with a second identifier. The first and second identifiers are adapted to distinguish the branch inlet ports from the branch outlet ports, facilitating subsequent operation and maintenance.

Further, a plurality of securing members are included and spaced from one another. The securing members are adapted to connect the main inlet and outlet pipes so that they run in parallel to, and are spaced apart from, each other, and to pre-secure them at a predetermined location of the liquid-cooled cabinet. Each securing member includes a pipe clamp and a locator. The pipe clamp fixes the main inlet and outlet pipes and enables the aforementioned angle to be adjusted. The locator fits over the pipe clamp and pre-secures the main inlet and outlet pipes at the predetermined location through the pipe clamp. Such dedicated locators provided on the cabinet body are adapted to pre-secure the liquid-cooled cabinet manifold. Final securing of the entire liquid-cooled cabinet manifold is accomplished by the pipe clamps in the securing members, enabling the liquid-cooled cabinet manifold to satisfy the requirement for easy computer room maintenance and replacement.

It is to be noted that, as used herein, the terms "first", "second" and the like are only meant to distinguish various components, elements, steps, etc. from each other rather than indicate logical or sequential orderings thereof, unless otherwise indicated or specified.

It is to be understood that while the invention has been described above with reference to preferred embodiments thereof, it is not limited to these embodiments. In light of the above teachings, any person familiar with the art may make many possible modifications and variations to the disclosed embodiments or adapt them into equivalent embodiments, without departing from the scope of the invention. Accordingly, it is intended that any and all simple variations, equivalent changes and modifications made to the foregoing embodiments based on the substantive disclosure of the invention without departing from the scope thereof fall within this scope.

What is claimed is:

1. A liquid-cooled cabinet manifold, for cooling a liquid-cooled cabinet, comprising a main inlet pipe and a main outlet pipe, which are arranged in parallel to and spaced apart from each other, the main inlet pipe having a main inlet port and a branch inlet port, the main outlet pipe having a main outlet port and a branch outlet port, the branch inlet port staggered from the branch outlet port along a direction of extension of the main inlet pipe, the branch inlet port and the branch outlet port forming an angle therebetween, the branch inlet port and the branch outlet port forming a pair which is connected to an object to be cooled in the liquid-cooled cabinet, wherein the liquid-cooled cabinet manifold further comprises a plurality of securing members which are spaced apart from one another, the securing members are configured to connect the main inlet pipe and the main outlet pipe so that the main inlet pipe and the main outlet pipe are parallel to and spaced apart from each other and pre-secured at a predetermined location of the liquid-cooled cabinet, and wherein each of the securing members comprises a pipe clamp and a locator, the pipe clamp is configured to secure the main inlet pipe and the main outlet pipe and enable an adjustment of the angle, the locator fits over the pipe clamp and is configured to pre-secure the main inlet pipe and the main outlet pipe at the predetermined location through the pipe clamp.

2. The liquid-cooled cabinet manifold of claim 1, wherein in operation, a cooling liquid is introduced into the main inlet pipe from the main inlet port, flows through the branch inlet port and the object to be cooled into the main outlet pipe from the branch outlet port corresponding to the branch inlet port, and exits the main outlet port.

3. The liquid-cooled cabinet manifold of claim 1, wherein in the direction of extension of the main inlet pipe, the adjacent branch inlet and outlet ports are spaced apart from each other.

4. The liquid-cooled cabinet manifold of claim 1, wherein the angle ranges from 0° to 180°.

5. The liquid-cooled cabinet manifold of claim 1, wherein a plurality of the branch inlet ports and a plurality of the branch outlet ports are provided, and a number of the branch inlet ports is equal to a number of the branch outlet ports and is greater than or equal to a number of the objects to be cooled.

6. The liquid-cooled cabinet manifold of claim 5, wherein the branch inlet ports and the branch outlet ports are all provided with a quick-connect connector, the quick-connect connectors at the branch inlet ports are all provided with a first identifier, the quick-connect connectors at the branch outlet ports are all provided with a second identifier, the first identifiers and the second identifiers are configured to distinguish the branch inlet ports from the branch outlet ports.

7. The liquid-cooled cabinet manifold of claim 6, wherein if the numbers of the branch inlet ports and the branch outlet ports are equal to the number of the objects to be cooled, the pairs of the branch inlet ports and the branch outlet ports are connected to the respective objects to be cooled by the quick-connect connectors;

wherein if the numbers of the branch inlet ports and the branch outlet ports are greater than the number of the objects to be cooled, some pairs of the branch inlet ports and the branch outlet ports are connected to the respective objects to be cooled by the quick-connect connectors, and the quick-connect connectors at remaining pairs of the branch inlet ports and the branch outlet ports are covered with caps configured to close the branch inlet ports and the branch outlet ports.

8. The liquid-cooled cabinet manifold of claim 1, wherein the pipe clamp is a dismantlable block defining two parallel through holes, through which the main inlet pipe and the main outlet pipe are respectively inserted, wherein the through holes each define in an inner wall thereof a plurality of grooves which are uniformly distributed circumferentially, and wherein the main inlet pipe and the main outlet pipe each define on an outer wall thereof limiting means each in engagement with a respective one of the grooves on the main inlet pipe or the main outlet pipe, so that the main inlet pipe and the main outlet pipe are prevented from rotating, and the branch inlet port and the branch outlet port are fixed at the predetermined angle.

9. The liquid-cooled cabinet manifold of claim 1, wherein the main inlet pipe has one end and another end which are opposing each other, and the main outlet pipe has one end and another end which are opposing each other, wherein the one end of the main inlet pipe is arranged on a same side as the one end of the main outlet pipe, the main inlet pipe is oriented so that the one end thereof is located above the other end thereof, wherein the main inlet port and the main outlet port are staggered from each other in the direction of extension of the main inlet pipe so that the main inlet port is situated between the one end of the main inlet pipe and the branch inlet port and that the main outlet port is situated between the one end of the main outlet pipe and the branch outlet port.

10. The liquid-cooled cabinet manifold of claim 9, further comprising two exhaust valves and two drain valves, the two exhaust valves provided respectively at the one end of the main inlet pipe and the one end of the main outlet pipe, the two drain valves provided respectively at the other end of the main inlet pipe and the other end of the main outlet pipe.

11. The liquid-cooled cabinet manifold of claim 1, further comprising a header inlet pipe and a header outlet pipe, the header inlet pipe connected to the main inlet port so as to supply a cooling liquid to the main inlet pipe via the main inlet port, the header outlet pipe connected to the main outlet port so as to discharge the cooling liquid from the main outlet pipe via the main outlet port.

12. The liquid-cooled cabinet manifold of claim 1, wherein the main inlet pipe and the main outlet pipe are both PVDF polymer pipes.

13. A liquid-cooled cabinet, comprising a cabinet body and the liquid-cooled cabinet manifold as defined in claim 1, the liquid-cooled cabinet manifold secured in a rear cable management region of the cabinet body, the cabinet body has therein at least one object to be cooled, each having a set of supply port and return port which are spaced apart from each other along the direction of extension of the liquid-cooled cabinet manifold, each set of the supply port and the return port corresponding to a respective pair of the branch inlet port and the branch outlet port so that the branch inlet port is connected to the supply port and the branch outlet port is connected to the return port.

14. The liquid-cooled cabinet of claim 13, wherein in operation, a cooling liquid flows into the supply port from the branch inlet port of the main inlet pipe, circulates to the branch outlet port from the return port, and exits the main outlet pipe.

15. The liquid-cooled cabinet of claim 13, wherein the locators are arranged to be spaced apart from one another along the direction of extension of the liquid-cooled cabinet manifold on an inner wall of the cabinet body in the rear cable management region, and wherein the pipe clamps are fixed to the locators so that the main inlet pipe and the main outlet pipe are pre-secured to the locators by the pipe clamps.

16. The liquid-cooled cabinet of claim 15, wherein each pair of the branch inlet port and the branch outlet port is staggered from each other in a 2 U space.

17. The liquid-cooled cabinet of claim 15, wherein the branch inlet port and the branch outlet port are provided with a quick-connect connector, and the supply port and the return port are provided with a second quick-connect connector, the first quick-connect connector at the branch inlet port connected to the second quick-connect connector at the supply port, the first quick-connect connector at the branch outlet port connected to the second quick-connect connector at the return port.

18. The liquid-cooled cabinet of claim 17, wherein the first quick-connect connectors are male quick-connect connectors and the second quick-connect connectors are female quick-connect connectors.

* * * * *